United States Patent [19]

Marshall et al.

[11] Patent Number: 4,713,563
[45] Date of Patent: Dec. 15, 1987

[54] D.C. BLOCK CAPACITOR CIRCUIT FOR REJECTION OF D.C. OFFSET

[75] Inventors: Christopher B. Marshall, Horley, England; Richard C. French, Stansted, United Kingdom

[73] Assignee: U.S. Philips Corporation, New York, N.Y.

[21] Appl. No.: 862,061

[22] Filed: May 12, 1986

[30] Foreign Application Priority Data

May 17, 1985 [GB] United Kingdom ............... 8512491

[51] Int. Cl.$^4$ ............... G06G 7/12; H03D 1/24; H03D 3/00; H04B 1/26
[52] U.S. Cl. ............... 307/490; 307/529; 307/493; 328/142; 329/124; 375/77; 455/324
[58] Field of Search ............... 307/358, 359, 490, 529, 307/512, 303; 328/147, 164, 167, 166, 142; 329/122, 124; 375/80, 77; 455/214, 324

[56] References Cited

U.S. PATENT DOCUMENTS

| | | | |
|---|---|---|---|
| 3,569,853 | 3/1971 | Wolejsza, Jr. ............... | 307/512 |
| 4,354,235 | 10/1982 | Blabeslee ............... | 307/358 |
| 4,481,675 | 11/1984 | Ichikawa et al. ............... | 307/358 |
| 4,517,680 | 5/1985 | Betts et al. ............... | 328/166 |
| 4,570,125 | 2/1986 | Gibson ............... | 329/122 |

FOREIGN PATENT DOCUMENTS

| | | | |
|---|---|---|---|
| 1383538 | 2/1975 | United Kingdom ............... | 307/359 |
| 2170368 | 7/1986 | United Kingdom ............... | 455/214 |

OTHER PUBLICATIONS

IEEE Spectrum, Jan. 1969, p. 52.
G. Wilson, "New Complex-Pole Single-Amplifier All-pass Filter with Reduced Active-Element Sensitivities", Electronics Letters, Jun. 24th 1976, vol. 12, No. 13.

Primary Examiner—Stanley D. Miller
Assistant Examiner—Trong Quang Phan
Attorney, Agent, or Firm—Robert T. Mayer; Bernard Franzblau

[57] ABSTRACT

A d.c. block capacitor circuit suitable as an integrated circuit in that it requires only one pin for the connection of an external capacitor. The circuit has particular, but not exclusive, application to direct conversion receivers. The circuit comprises an operational amplifier (10) having an inverting and a non-inverting input and an output. A pair of resistors (12, 14) having values R1, R1', respectively, connect the respective amplifier inputs to a signal input (16). The amplifier has a feedback resistor (18) having a value R2 connected between the inverting input and the output. Another resistor (20) having a value R2' and a capacitor (22) are connected between the non-inverting input and either and same or different voltage reference point(s). The values of the resistors (12, 14, 18, 20) are selected so that the ratio of R2':R1' equals the ratio R2:R1. Any d.c. offset present in the input signal is rejected by the circuit so that the output therefrom comprises the signal centered on the reference voltage.

17 Claims, 3 Drawing Figures

D.C. BLOCK CAPACITOR CIRCUIT FOR REJECTION OF D.C. OFFSET

BACKGROUND OF THE INVENTION

The present invention relates to a d.c. block capacitor circuit which has particular, but not exclusive, application in integrated circuits, especially integrated direct conversion receivers.

A known d.c. block capacitor circuit comprises an amplifier having an input to which a capacitor is connected, the input being coupled to a reference voltage point by a way of a resistance. In operation, when a low frequency signal is applied to a signal input terminal to which the capacitor is connected, the capacitor behaves as an open circuit and blocks the d.c. so that the gain of the circuit is zero. In contrast, at high frequencies the capacitor acts as a short circuit and the gain will be the normal gain of the amplifier. The disadvantage of this circuit, when integrated as a monolithic device, is that when long time constants are required the capacitor has to have a large value and cannot be conveniently integrated. Two pins therefore have to be reserved for connecting an external component to the monolithic device. When implementing a circuit, particularly an analogue circuit, as a monolithic device the pin count can be a dominating factor and therefore reducing the requirement for external connections is of importance to a circuit designer.

SUMMARY OF THE INVENTION

An object of the present invention is to reduce the number of pins required when integrating a d.c. block capacitor circuit.

According to the present invention there is provided a d.c. block capacitor circuit comprising an operational amplifier having an inverting input, a non-inverting input and an output, a first resistance means coupled between a signal input and the inverting input, a second resistance means coupled between the output and the inverting input, a third resistance means coupled between the signal input and the non-inverting input, a fourth resistance means coupled between the non-inverting input and a first reference voltage point, the ratio of the value of the second resistance means to the value of the first resistance means being substantially the same as the ratio of the value of the fourth resistance means to the value of the third resistance means, and a capacitor coupled between the non-inverting input and a second reference voltage point.

If desired, the first and third resistance means may have substantially the same resistance value and the second and fourth resistance means may have substantially the same resistance value.

The first and second reference voltage points may be at the same voltage.

In one embodiment of the present invention the operational amplifier and the first, second, third and fourth resistance means are integrated in the same monolithic device. The capacitor is connected between one pin, that is, the pin coupled to the non-inverting input of the operational amplifier, and the reference voltage point which comprises an already used pin.

Thus a saving of one pin is achieved compared to the known circuit.

In another embodiment of the present invention the operational amplifier and the first, second and third resistance means are integrated in the same monolithic device. The fourth resistance means and the capacitor are external to the device. Such an embodiment is particularly useful in the case of the fourth resistance means having a high value requiring a substantial area of the device for integration. Thus, not only is a pin saved but also chip area is saved.

When integrating the device, at least one of the first to fourth resistance means may be simulated electronically which may economise on the area required to implement the particular resistance means.

The present invention also relates to a direct conversion receiver having a pair of quadrature related mixers, the signal paths from which each include at least one d.c. blocking capacitor circuit made in accordance with the invention.

BRIEF DESCRIPTION OF THE DRAWINGS

The present invention will now be described, by way of example, with reference to the accompany drawing, wherein.

In the drawing corresponding reference numerals have been used to indicate the same features.

DESCRIPTION OF THE PREFERRED EMBODIMENTS

Figure 1:
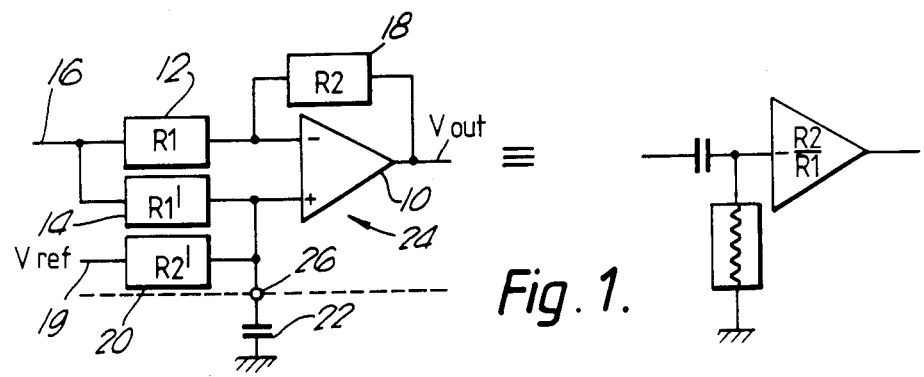
FIG. 1 is a schematic circuit diagram of a first embodiment of the present invention and its equivalent circuit.

The left hand circuit shown in FIG. 1 comprises an operational amplifier 10 having an inverting input, a non-inverting input and an output. Resistors 12, 14 having values R1 and R1' are coupled between an input 16 and the inverting and non-inverting inputs of the amplifier 10, respectively. A resistor 18 of value R2 is coupled as a feedback resistor between the amplifier output and inverting input. A resistor 20 having a value R2' is connected between a reference voltage point at Vref and the non-inverting input of the amplifier 10. A capacitor 22 is connected between another reference voltage point, in this example, ground, and the non-inverting input of the amplifier 10. In the event of implementing the circuit shown in FIG. 1 as an integrated circuit, the operational amplifier 10 and the resistors 12, 14, 18 and 20 comprise part of a monolithic device 24 and the capacitor 22 is external of the device 24 and is connected to a pin 26. When selecting the values of the resistors 12, 14, 18, 20, one criterion is that the resistance ratio R2':R1' must be substantially the same as R2:R1. In specific embodiments it is convenient to make R1 and R1' equal and R2 and R2' equal.

In operation a signal plus a d.c. offset are present at the input 16, Vref is applied to the point 19 and the output, Vout, comprises the signal plus Vref. The blocking of the d.c. offset is explained as follows. The capacitor 22 connected between the non-inverting input and ground behaves as an open circuit at low frequencies (including d.c.). Therefore at these frequencies the non-inverting input receives a fraction of the input signal (relative to Vref) as a result of the potential divider formed by resistors 14 and 20. The operational amplifier 10 acts to maintain the inverting and non-inverting inputs at the same potential. Because the resistors 12, 18 are in the same ratio as the resistors 14, 20, then the amplifier must be maintained Vout equal to Vref. Vout is in consequence not affected by d.c. and low frequency inputs.

At high frequencies, however, the capacitor 22 behaves as a short circuit so that the non-inverting input is effectively grounded. Thus, as far as high frequency signals are concerned the amplifier circuit on the left hand side of FIG. 1 is configured as a normal inverting amplifier with a gain determined by R2/R1. Hence the overall performance of this circuit is equivalent to an inverting amplifier having a capacitor connected to its input and a resistor connected from the input to ground, i.e. the circuit illustrated on the right in FIG. 1. However, as explained in the preamble of this specification, the capacitor would require two pins.

Figure 2:
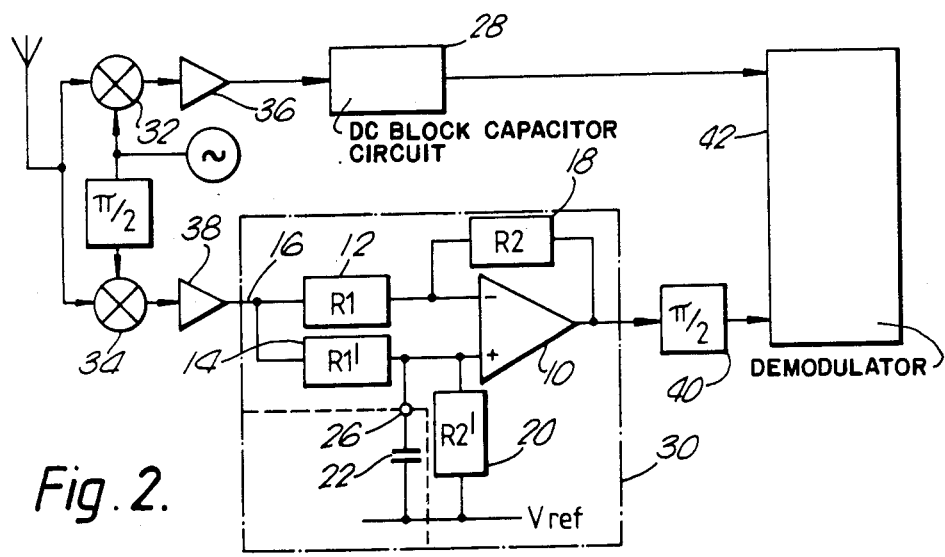
FIG. 2 is a block diagram of a direct conversion receiver including a second embodiment of the present invention.

The d.c. block capacitor circuit 30 shown in FIG. 2 is substantially the same as the left hand circuit in FIG. 1 with the difference that the resistor 20 and capacitor 22 are both connected to Vref. The Vref connection will normally be available and can be shared by any number of d.c. blocking capacitor circuits.

The circuit 30 has been shown connected in a direct conversion receiver which includes quadrature related mixers 32, 34 whose outputs are connected to respective amplifiers 36, 38. D.C. block capacitor circuits 28, 30, which effectively act as high pass filters, are connected to the outputs of the amplifiers 36, 38 respectively. The signal from the circuit 30 is phase shifted by $\pi/2$ in a phase shifter 40 after which the signals in the respective paths are applied to a demodulator 42.

Figure 3:
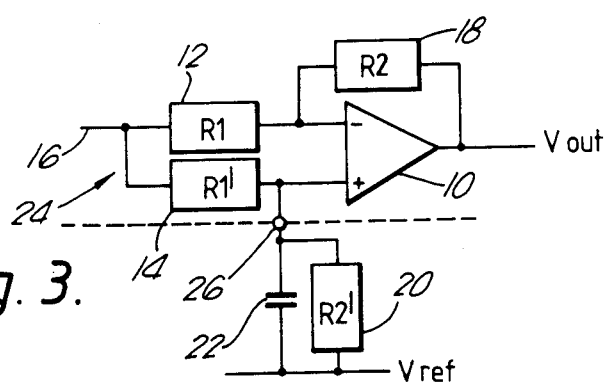
FIG. 3 is a schematic circuit diagram of a third embodiment of the present invention.

FIG. 3 illustrates another embodiment of the invention in which the capacitor 22 and the resistor 20 are both off-chip and are connected to the pin 26. An advantage of both these components being off-chip is that if the resistor 20 has a high value, then substantial chip area will be saved.

If the resistors 12, 14 are perfectly matched then the rejection of the d.c. offset would be perfect. However, any mismatch will mean that a small fraction, related to the degree of mismatch of the offset voltage, will reach the output.

When implementing the illustrated circuits as part of a monolithic device, one or more of the resistors 12, 14, 18 and 20 may comprise diffused resistors or electronically simulated resistors. For large value resistors it is beneficial from the point of view of economising on chip area to simulate one or more of them electronically. Thus the relevant physical resistor may be replaced by one port of a so-called "active transformer" (also known as a positive-impedance converter) the other port of which is itself loaded with a resistor. Active transformers are discussed, for example, on page 52 of IEEE Spectrum, January 1969, and are two-ports described by the h-matrix $$[h] = \begin{bmatrix} 0 & +\alpha \\ +\beta & 0 \end{bmatrix} \quad \alpha \neq \beta$$

where $\alpha$ and $\beta$ are real and non-negative members.

We claim:

1. A d.c. block capacitor circuit comprising an operational amplifier having an inverting input, a non-inverting input and an output, a first resistance means coupled between a signal input terminal and the inverting input, a second resistance means coupled between the output and the inverting input, a third resistance means coupled between the signal input terminal and the non-inverting input, a fourth resistance means coupled between the non-inverting input and a first reference voltage point, the ratio of the value of the second resistance means to the value of the first resistance means being substantially the same as the ratio of the value of the fourth resistance means to the value of the third resistance means, and a capacitor coupled between the non-inverting input and a second reference voltage point.

2. A circuit as claimed in claim 1, wherein the first and third resistance means have substantially the same resistance value and the second and fourth resistance means have substantially the same resistance value.

3. A circuit as claimed in claim 2, wherein the first and second reference voltage points are at the same voltage.

4. A circuit as claimed in claim 3, wherein the operational amplifier and the first, second, third and fourth resistance means are integrated in the same monolithic device and the capacitor is connected to a pin on the device.

5. A circuit as claimed in claim 2, wherein the operational amplifier and the first, second and third resistance means are integrated in the same monolithic device and the fourth resistance means and the capacitor are connected to the same pin of the monolithic device.

6. A circuit as claimed in claim 5, wherein at least one of the first, second, third and fourth resistance means is simulated electronically.

7. A circuit as claimed in claim 1, wherein the first and second reference voltage points are at the same voltage.

8. A circuit as claimed in claim 1, wherein the operational amplifier and the first, second, third and fourth resistance means are integrated in the same monolithic device and the capacitor is connected to a pin on the device.

9. A circuit as claimed in claim 8, wherein at least one of the first, second, third and fourth resistance means is simulated electronically.

10. A circuit as claimed in claim 1, wherein the operational amplifier and the first, second and third resistance means are integrated in the same monolithic device and the fourth resistance means and the capacitor are connected to the same pin of the monolithic device.

11. A DC block capacitor circuit as claimed in claim 1 wherein the fourth resistance means is coupled between the first reference voltage point and the amplifier non-inverting input via a current path that excludes the third resistance means.

12. A DC block capacitor circuit as claimed in claim 1 wherein the fourth resistance means and the capacitor are directly connected to the amplifier non-inverting input.

13. A DC block capacitor circuit as claimed in claim 1 wherein the first and third resistance means are connected to form a common junction point that is coupled to said signal input terminal.

14. A DC block capacitor circuit as claimed in claim 13 wherein the fourth resistance means and the capacitor are directly connected to the amplifier non-inverting input.

15. A direct conversion receiver comprising: first and second mixer circuits each having first and second inputs, a signal input terminal coupled to the first inputs of the first and second mixer circuits, a sinusoidal reference source coupled to the second input of the first mixer circuit and via a first 90° phase shift circuit to the second input of the second mixer circuit, a demodulator having first and second inputs, first and second DC block capacitor circuits, means connecting an output of the first mixer circuit to the first input of the demodulator via said first DC block capacitor circuit, a second 90° phase shift circuit, and means connecting an output of the second mixer circuit to the second input of the demodulator via a series connection of the second DC block capacitor circuit and the second 90° phase shift circuit.

16. A direct conversion receiver as claimed in claim 15 wherein each of said DC block capacitor circuits comprise: an operational amplifier having an inverting input, a non-inverting input and an output, a first resistance means coupled between the inverting input and the output of its respective mixer circuit, a second resistance means coupled between the amplifier output and the amplifier inverting input, a third resistance means coupled between the amplifier non-inverting input and said respective mixer circuit output, a fourth resistance means coupled between the non-inverting input and a first reference voltage point, the ratio of the value of the second resistance means to the value of the first resistance means being substantially the same as the ratio of the value of the fourth resistance means to the value of the third resistance means, and a capacitor coupled between the non-inverting input and a second reference voltage point.

17. A direct conversion receiver as claimed in claim 16 wherein said first and second reference voltage points comprise a single reference voltage connection.

* * * * *